United States Patent
Yang et al.

(10) Patent No.: US 7,760,009 B2
(45) Date of Patent: Jul. 20, 2010

(54) POWER-DOWN CIRCUIT WITH SELF-BIASED COMPENSATION CIRCUIT

(75) Inventors: Ping-Lin Yang, Tianzhong Township (TW); Hsin-Hsin Ko, Hsin-Chu (TW); Chung-Cheng Chou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 33 days.

(21) Appl. No.: 12/328,305

(22) Filed: Dec. 4, 2008

(65) Prior Publication Data

US 2010/0141330 A1   Jun. 10, 2010

(51) Int. Cl.
*H03K 3/01* (2006.01)
(52) U.S. Cl. .................. 327/534; 327/544
(58) Field of Classification Search .......... 327/530, 327/534, 535, 537, 544
See application file for complete search history.

(56) References Cited

U.S. PATENT DOCUMENTS

| | | | |
|---|---|---|---|
| 7,042,274 B2 | 5/2006 | Hazucha et al. | |
| 7,080,341 B2 | 7/2006 | Eisenstadt et al. | |
| 7,342,845 B2 | 3/2008 | Somasekhar et al. | |
| 7,605,601 B2 * | 10/2009 | Tachibana et al. | 326/21 |
| 7,671,663 B2 * | 3/2010 | Houston et al. | 327/534 |

* cited by examiner

*Primary Examiner*—Jeffrey S Zweizig
(74) *Attorney, Agent, or Firm*—Slater & Matsil, L.L.P.

(57) ABSTRACT

A circuit includes a first power supply node at a first power supply voltage; a gated-node; and a first control device coupled between the first power supply node and the gated-node. The first control device is configured to pass the first power supply voltage to the gated-node or to disconnect the gated-node from the first power supply voltage. A second control device is coupled between the first power supply node and the gated-node. The second control device is configured to pass a gated-voltage to the gated-node or disconnect the gated-node from the gated-voltage. A voltage-drop device is coupled between the first power supply node and the gated-node, wherein the voltage-drop device is serially connected with the second control device. A negative-feedback current source is connected in parallel with the voltage-drop device. The negative-feedback current source is configured to provide a current tracking a variation of the gated-voltage at the gated-node.

20 Claims, 6 Drawing Sheets

POWER-DOWN CIRCUIT WITH SELF-BIASED COMPENSATION CIRCUIT

TECHNICAL FIELD

This invention relates generally to integrated circuits, and more particularly to power-providing schemes using gated power supplies, and even more particularly to the reduction in the variation of the gated power supply voltages.

BACKGROUND

In portable electronic devices, such as mobile communication devices, reducing power consumption is one of the key requirements in the respective integrated circuit design. One of the methods for reducing the power consumption is using dual operation mode, in which the normal operation of the integrated circuit may use normal operation voltage VDD, which is high enough to drive the integrated circuit to achieve required high performance. In other operations, not so demanding to the performance, a gated-VDD may be used to provide power to the integrated circuits. Under the gated-VDD that is lower than the operation voltage VDD, less power is consumed. The gated-VDD, although causing the performance of the integrated circuit to be sacrificed, is not an issue in certain operations, such as in the power down mode or standby mode.

FIG. 1 illustrates a conventional circuit capable of providing operation voltage VDD and a gated-VDD. PMOS transistors P1 and P2 are used to control whether operation voltage VDD or the gated-VDD is supplied to main circuit 102. By supplying a low voltage to the gate of PMOS transistor P1 and a high voltage to the gate of PMOS transistor P2, operation voltage VDD is provided to main circuit 102. Conversely, by supplying a high voltage to the gate of PMOS transistor P1 and a low voltage to the gate of PMOS transistor P2, the gated-VDD, which equals voltage VDD minus the voltage drop on diode D1, is provided to main circuit 102.

The conventional circuit, however, suffers from drawbacks. FIG. 2 schematically illustrates an I-V curve of diode D1. It is noted that voltage drop Vdiode is related to the current Idiode flowing through diode D1, and a fluctuation ΔI in current Idiode causes a fluctuation ΔV in voltage drop Vdiode, and vice versa. Therefore, the gated-VDD varies when the current Idiode flowing through diode D1 varies.

In addition, the voltage-drop Vdiode and the gated-VDD are also affected by process variations and temperature variations. For example, the gated-VDD of one circuit working at a slow-slow (SS) process corner, meaning both PMOS and NMOS transistors have slow performance and low power consumption, may have a gated-VDD of about 0.707 volts. Another circuit having the same circuit design but working at a fast-slow (FS) process corner, meaning NMOS transistors are fast while PMOS transistors are slow, however, may only have a gated-VDD of about 0.579 volts. Such low voltage may cause main circuit 102 to malfunction. For example, the memories in main circuit 102 may lose data. A solution is thus needed to reduce the variation in the gated-VDD.

SUMMARY OF THE INVENTION

In accordance with one aspect of the present invention, a circuit includes a first power supply node at a first power supply voltage; a gated-node; and a first control device coupled between the first power supply node and the gated-node. The first control device is configured to pass the first power supply voltage to the gated-node or to disconnect the gated-node from the first power supply voltage. A second control device is coupled between the first power supply node and the gated-node. The second control device is configured to pass a gated-voltage to the gated-node or disconnect the gated-node from the gated-voltage. A voltage-drop device is coupled between the first power supply node and the gated-node, wherein the voltage-drop device is serially connected with the second control device. A negative-feedback current source is connected in parallel with the voltage-drop device. The negative-feedback current source is configured to provide a current tracking a variation of the gated-voltage at the gated-node.

In accordance with another aspect of the present invention, a circuit includes a first power supply node at a first power supply voltage; a gated-node; a first transistor including a source coupled to the first power supply node, and a drain coupled to the gated-node; and a second transistor having a source coupled to the first power supply node, and a drain. A diode is coupled between the drain of the second transistor and the gated-node. A voltage-controlled current source is connected in parallel with the diode, wherein the voltage-controlled current source includes an input node. A gated voltage-tracking circuit including an output is connected to the input node of the voltage-controlled source. The gated voltage-tracking circuit is coupled to the gated-node, and is configured to generate a bias voltage tracking a variation in a gated-voltage at the gated-node.

In accordance with yet another aspect of the present invention, a circuit includes a VDD power node, and a gated-node. The circuit further includes a first PMOS transistor having a source coupled to the VDD power node, and a drain coupled to the gated-node; and a second PMOS transistor having a source coupled to a first power supply node, and a drain. A first diode and a second diode are connected in parallel and coupled between the drain of the second PMOS transistor and the gated-node, wherein the first diode and the second diode are formed of transistors having opposite types. The circuit further includes a bias node; and a third PMOS transistor, which includes a source coupled to the drain of the second PMOS transistor; a drain coupled to the gated-node; and a gate coupled to the bias node. A gated voltage-tracking circuit is coupled to, and outputting a bias voltage to, the bias node. The gate voltage-tracking circuit is coupled to the gated-node, and is configured so that the bias voltage tracks a change in a gated-voltage at the gated-node.

The advantageous features of the present invention include reduced variations in the gated-VDD and a gated-VSS. As a result, the performance and reliability of the integrated circuits drawing power from the gated-VDD or the gated-VSS are improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The embodiments discussed are merely illustrative of specific ways to make and use the invention, and do not limit the scope of the invention.

A novel power supply circuit capable of providing a gated power supply voltage (a gated-VDD or a gated-VSS) having a reduced variation is provided. The variations and the operation of the preferred embodiments are discussed. Throughout the various views and illustrative embodiments of the present invention, like reference numbers are used to designate like elements.

Figure 1:
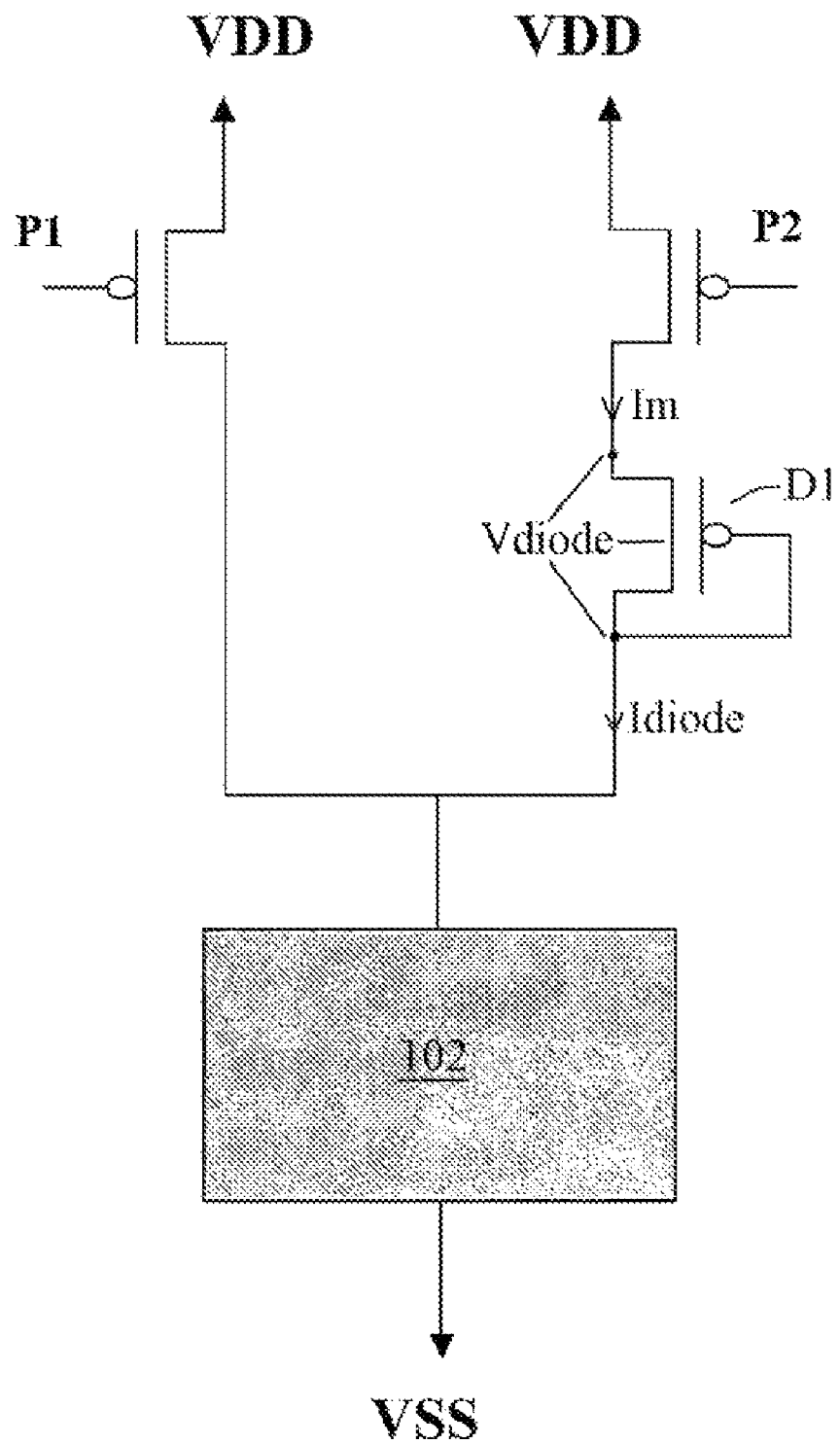
FIG. 1 illustrates a conventional circuit for providing a gated-VDD, wherein a diode is used to generate the gated-VDD.
Figure 2:
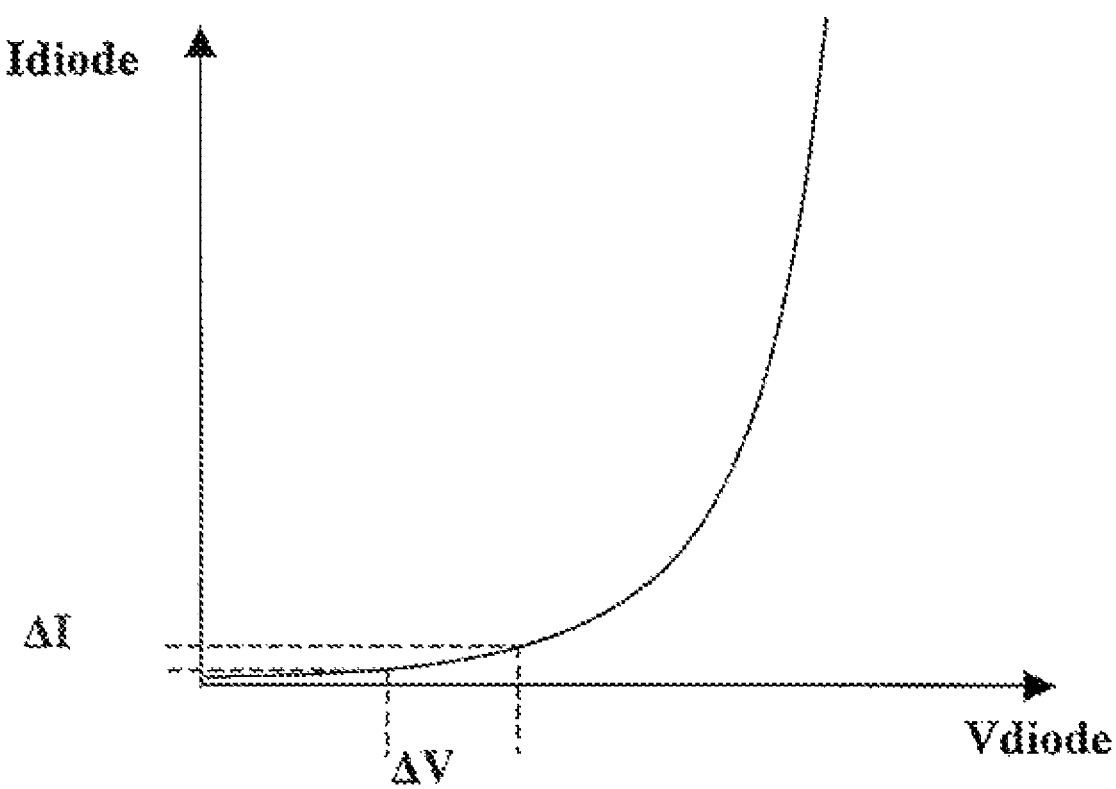
FIG. 2 illustrates an I-V curve of the diode.
Figure 3:
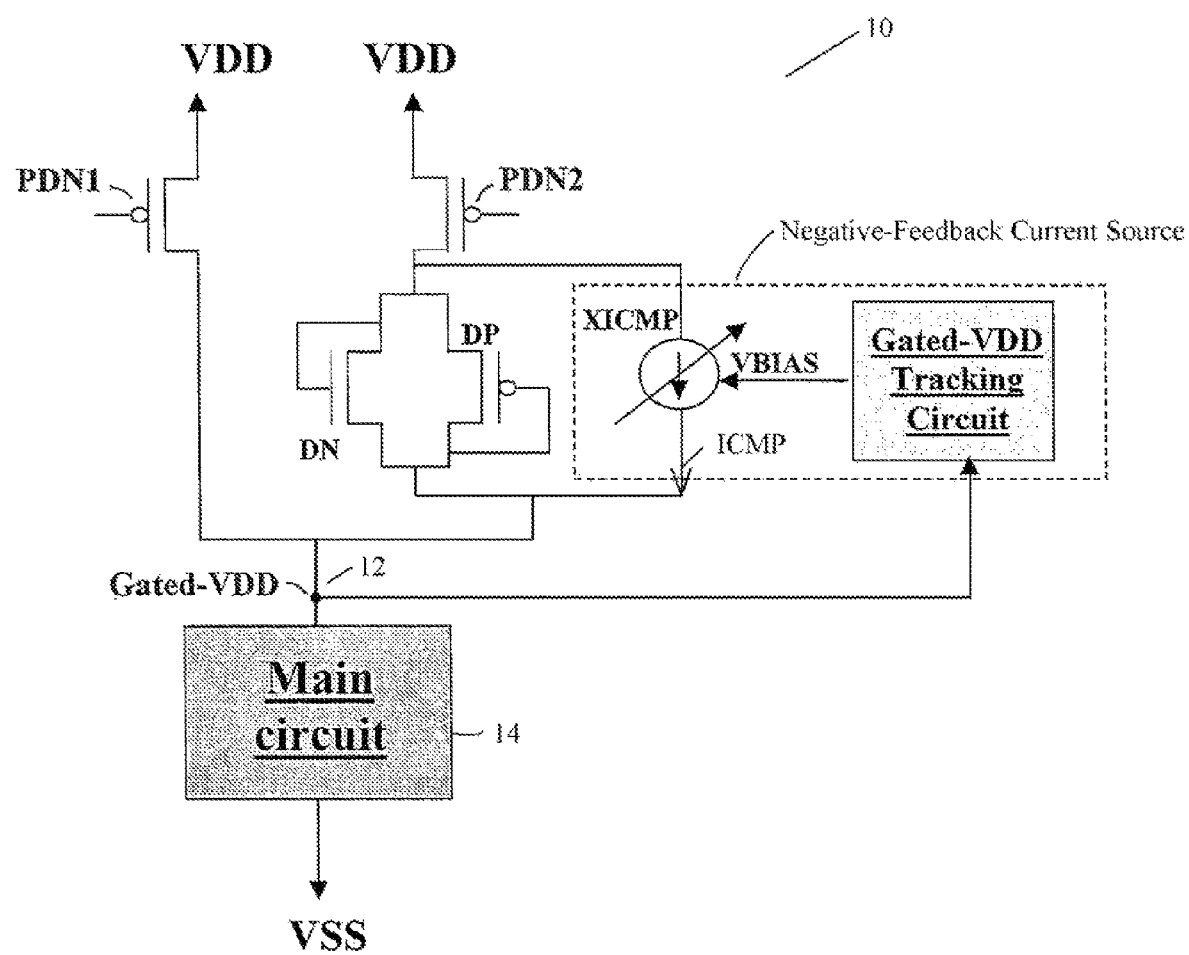
FIG. 3 illustrates an embodiment of the present invention, wherein a gated-VDD with a reduced variation is provided.

FIG. 3 illustrates an embodiment of the present invention. Circuit 10 includes main circuit 14 coupled between power supply node(s) VDD, which provide power supply voltage VDD, and power supply node(s) VSS, which have voltages VSS, possibly a ground. Main circuit 14 is connected to node 12, which may be either at a voltage equal to the gated-VDD, or substantially equal to voltage VDD if the gated-VDD is undesirable. Preferably, the gated-VDD is lower than voltage VDD. For example, the gated-VDD may be between about 60% and about 70% of voltage VDD. The gated-VDD may be provided to main circuit 14 in a power down mode. In a normal operation mode, node 12 may be at the normal operation voltage VDD.

PMOS transistors PDN1 and PDN2 are used to control whether operation voltage VDD or gated-VDD is supplied to main circuit 14. By supplying a low voltage, for example, 0 V, to the gate of PMOS transistor PDN1 and a high voltage, for example, voltage VDD, to the gate of PMOS transistor PDN2, operation voltage VDD is provided to node 12 and main circuit 14. Conversely, by supplying the high voltage to the gate of PMOS transistor PDN1 and the low voltage to the gate of PMOS transistor PDN2, the gated-VDD is provided to main circuit 14.

In an exemplary embodiment, a pair of diodes DN and DP (alternatively referred to as voltage-drop diodes) is combined to provide a desirable voltage drop. Both diodes DN and DP are forward biased. Each of the diodes, DN and DP, may be formed of a transistor, which has its gate connected to a drain. Diode DN is formed of an NMOS transistor, while diode DP is formed of a PMOS transistor. Advantageously, combining the NMOS and PMOS transistors may reduce the process-corner related variations since these two transistors may compensate for each other's variation. In alternative embodiments, diodes DN and DP may be replaced with a single diode formed of a PMOS transistor or an NMOS transistor, or more than two diodes.

A negative-feedback current source is connected in parallel with diodes DN and DP. The negative-feedback current source shares the current that otherwise would flow solely through diodes DN and DP. The negative-feedback current source provides a small and sensitive current that could compensate the increased leakage current in some operation situations. Preferably, the negative-feedback current source is controlled by, and has a negative response to the magnitude of, the gated-VDD at node 12. If the gated-VDD at node 12 increases, the current ICMP provided by the negative-feedback current source decreases, so that a greater current flows through diodes DN and DP. As is known in the art, the voltage-drop in diodes increases when the currents flowing through the diodes increase, and vice versa. When the gated-VDD increases, due to the feedback of the negative-feedback current source, the voltage-drop in diodes DN and DP increases, and hence the gated-VDD is pulled down. Conversely, if the gated-VDD at node 12 decreases, the current ICMP increases so that a smaller current flows through diodes DN and DP. As a result, the voltage drop in diodes DN and DP decreases, and hence the gated-VDD is lifted up. Accordingly, the variation in the gated-VDD is fed back to the negative-feedback current source, and hence the variation in the gated-VDD is at least partially compensated for, and possibly substantially eliminated.

The negative-feedback current source includes a voltage-controlled current source XICMP, which provides current ICMP according to a bias voltage VBIAS. In an embodiment, the gated-VDD may be directly used as the bias voltage VBIAS to control the voltage-controlled current source XICMP. However, to make the change in current ICMP more sensitive to the change in the gated-VDD, a gated-VDD tracking circuit may be added, which may amplify the variation in the gated-VDD to supply the bias voltage VBIAS. In other words, the bias voltage VBIAS provided by the gated-VDD tracking circuit tracks the change in the gated-VDD, possibly in greater scale. Also, bias voltage VBIAS may be adjusted to a more appropriate range to suit the requirement of the voltage-controlled current source.

Figure 4:
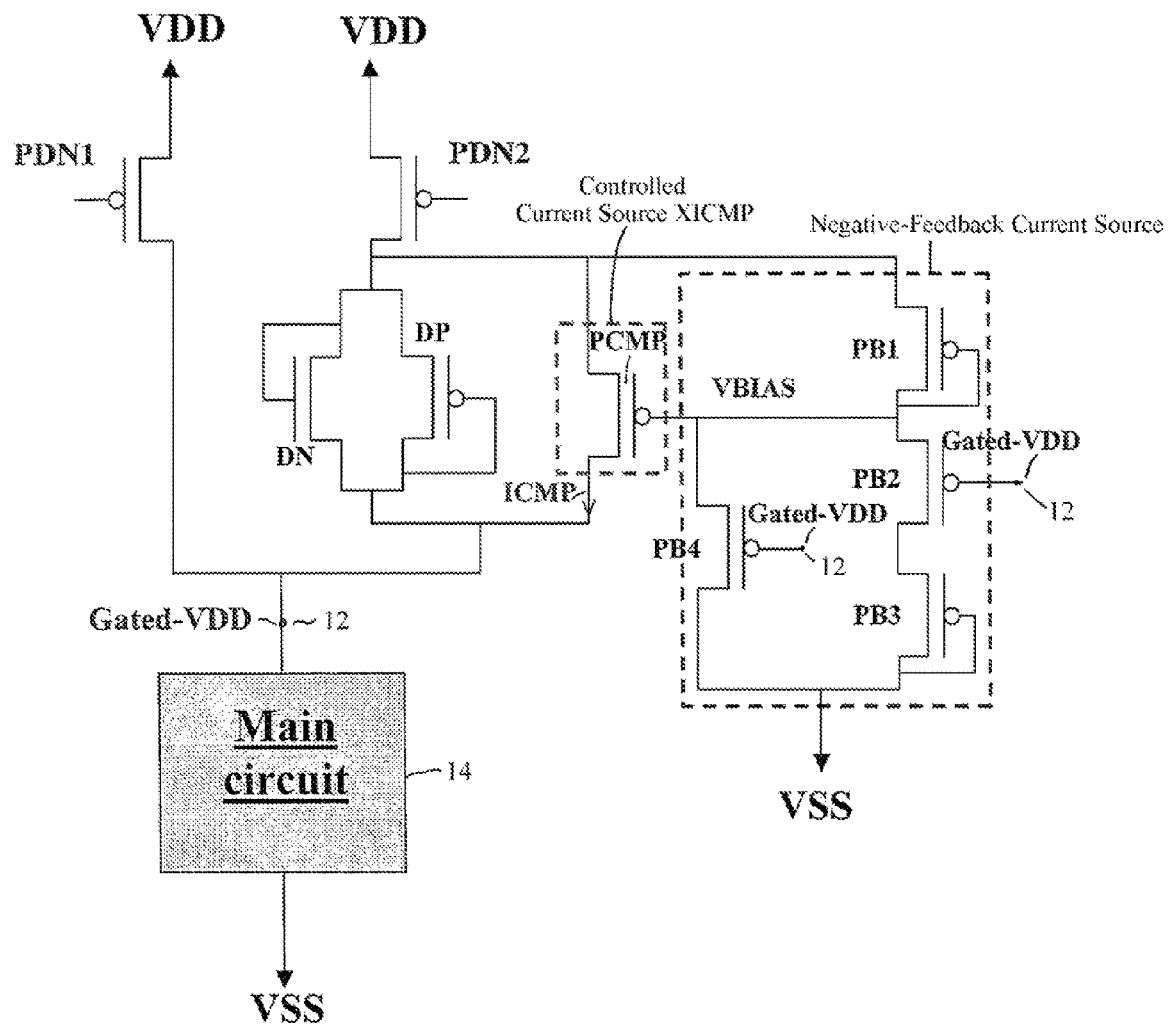
FIG. 4 illustrates a circuit implementing the embodiment shown in FIG. 3.

FIG. 4 illustrates a circuit for implementing the embodiment shown in FIG. 3. In this implementation, the voltage-controlled current source XICMP includes PMOS transistor PCMP, whose source-drain current has a negative response to its gate voltage VBIAS. The gated-VDD tracking circuit includes PMOS transistors PB1, PB2, PB3, and PB4. The gate of PMOS transistor PB4 is controlled by the gated-VDD. When the gated-VDD decreases, PMOS transistor PB4 is more conductive, and hence pulls bias voltage VBIAS down. Conversely, an increase in the gated-VDD will cause an increase in voltage VBIAS. On the other hand, PMOS transistors PB1, PB2 and PB3 form another path for controlling bias voltage VBIAS, wherein PMOS transistors PB1 and PB3 are connected as bias-diodes for dividing voltages. When the gated-VDD decreases, PMOS transistor PB2 is more conductive, and hence also pulls bias voltage VBIAS down. Similarly, an increase in the gated-VDD will cause the increase in bias voltage VBIAS. Through this scheme, bias voltage VBIAS tracks the change in the gated-VDD, preferably in a magnitude great enough so that the change in the gated-VDD is substantially compensated for.

Figure 5:
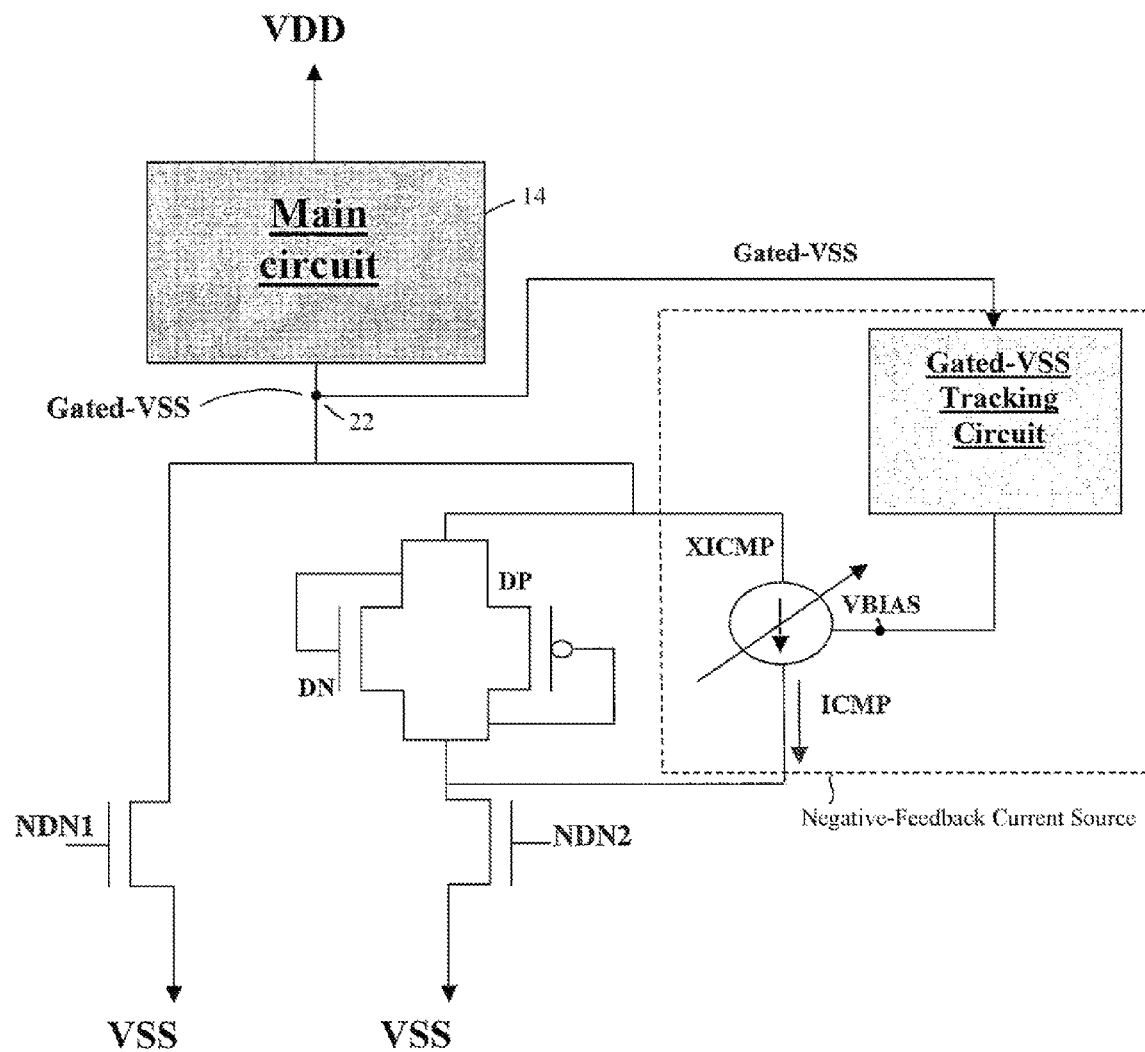
FIG. 5 illustrates an alternative embodiment of the present invention, wherein a gated-VSS with a reduced variation is provided.
Figure 6:
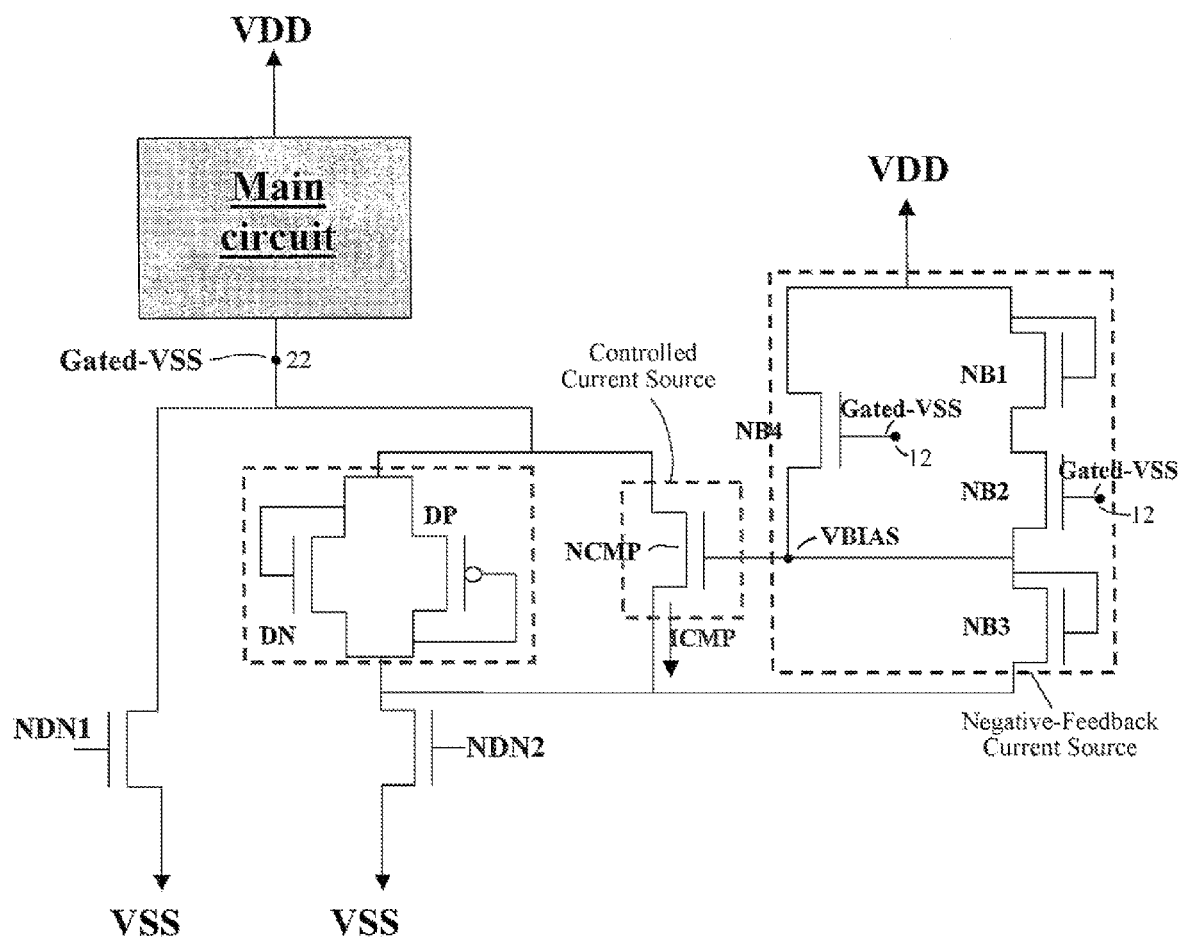
FIG. 6 illustrates a circuit implementing the embodiment shown in FIG. 5.

FIGS. 5 and 6 illustrate an alternative embodiment of the present invention. In this embodiment, instead of gating operation power supply voltage VDD, power supply voltage VSS is gated. The gated-VSS is higher than normal voltage VSS, for example, by between about 30% and about 40% of (VDD−VSS). In normal operation mode, main circuit 14 may be supplied with power supply voltages VDD and VSS. In power-down mode, the voltage at node 22 is increased to the gated-VSS, and hence the voltage difference (VDD−gated-VSS), which is applied onto main circuit 14, is less than (VDD−VSS). The power consumption is thus reduced.

Referring to FIG. 5, NMOS transistors NDN1 and NDN2 are used to control whether operation voltage VSS or the gated-VSS is supplied to main circuit 14. By supplying a high voltage, for example, VDD, to the gate of NMOS transistor NDN1 and a low voltage, for example, 0 V, to the gate of NMOS transistor NDN2, operation voltage VSS is provided to node 22 and main circuit 14. Conversely, by supplying the low voltage to the gate of NMOS transistor NDN1 and the high voltage to the gate of NMOS transistor NDN2, the gated-VSS is provided to main circuit 14.

FIG. 5 also illustrates the negative-feedback current source, which includes the voltage-controlled current source XICMP. Further, a gated-VSS tracking circuit is provided to generate a control voltage for controlling voltage-controlled current source XICMP. Voltage-controlled current source XICMP provides current ICMP. Similar to the embodiment shown in FIG. 3, the negative-feedback current source is connected in parallel with diodes DN and DP, and shares the current that otherwise would flow solely through diodes DN and DP. Preferably, the negative-feedback current source is controlled by, and has a negative response to the magnitude of, the gated-VSS at node 22. If the gated-VSS at node 22 increases, the current ICMP increases so that less current flows through diodes DN and DP. Conversely, if the gated-VSS decreases, current ICMP decreases so that a greater current flows through diodes DN and DP. Therefore, current ICMP also tracks the variation in the gated-VSS. Accordingly, when the gated-VSS decreases, due to the feedback of the negative-feedback current source, the voltage-drop in diodes DN and DP increases, and hence the gated-VSS is lifted up. Conversely, when the gated-VSS increases, the voltage-drop in diodes DN and DP decreases, and hence the gated-VSS is pulled down.

FIG. 6 illustrates an exemplary circuit implementing the embodiment shown in FIG. 5. In this implementation, the voltage-controlled current source XICMP includes NMOS transistor NCMP, whose source-drain current has a positive response to its gate voltage VBIAS. The gated-VSS tracking circuit includes NMOS transistors NB1, NB2, NB3, and NB4. The gate of NMOS transistor NB4 is controlled by the gated-VSS. When the gated-VSS increases, NMOS transistor NB4 is more conductive, and hence pulls bias voltage VBIAS up. Conversely, a decrease in the gated-VSS will cause the decrease in bias voltage VBIAS. On the other hand, NMOS transistors NB1, NB2 and NB3 form another path for controlling bias voltage VBIAS, wherein NMOS transistors NB1 and NB3 are connected as bias-diodes for dividing voltages. When the gated-VSS increases, NMOS transistor NB2 is more conductive, and hence also pulls bias voltage VBIAS up. Similarly, a decrease in the gated-VSS will cause the decrease in voltage VBIAS. Through this scheme, bias voltage VBIAS tracks the change in the gated-VSS and controls the voltage-controlled current source XICMP to provide a negative feedback to the gated-VSS.

One skilled in the art will realize that there are many variations in the implementation of the circuit diagram shown in FIGS. 3 and 5.

By using the embodiments of the present invention, the variation in the gated power supply voltage (gated-VDD or gated-VSS), which variation may be the result of process, voltage, and temperature (PVT) variations, is reduced. Simulation results performed on a circuit formed using 45 nm technology, with voltage VDD equal to 0.9 V, reveal that the embodiments of the present invention may reduce the variation in the gated-VDD to 94 mV, as compared to the 128 mV variation in conventional circuits. This means a 26.3% reduction in the variation in the gated-VDD may be achieved. Therefore, the embodiments of the present invention may work more reliably at different process corners.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:
    a first power supply node at a first power supply voltage;
    a gated-node;
    a first control device coupled between the first power supply node and the gated-node, wherein the first control device is configured to pass the first power supply voltage to the gate-node or to disconnect the gated-node from the first power supply voltage;
    a second control device coupled between the first power supply node and the gated-node, wherein the second control device is configured to pass a gated-voltage to the gated-node or to disconnect the gated-node from the gated-voltage;
    a voltage-drop device comprising at least a diode coupled between the first power supply node and the gated-node, wherein the voltage-drop device is serially connected with the second control device; and
    a negative-feedback current source connected in parallel with the voltage-drop device, wherein the negative-feedback current source is configured to provide a current tracking a variation of the gated-voltage at the gated-node.

2. The circuit of claim 1 further comprising:
    a second power supply node, wherein the first power supply node and the second power supply node comprise a VDD node and a VSS node; and
    a main circuit between the gated-node and the second power supply node.

3. The circuit of claim 1, wherein the negative-feedback current source comprises:
    a bias-voltage node;
    a voltage-controlled current source connected to the bias-voltage node and being configured to generate a current parallel to a current in the voltage-drop device; and
    a gated voltage-tracking circuit connected to the gated-node and the voltage-controlled current source, wherein the gated voltage-tracking circuit is configured to generate a bias voltage tracking a change in the gated-voltage.

4. The circuit of claim 3, wherein the voltage-controlled current source comprises a transistor comprising a first source/drain coupled to a first end of the voltage-drop device, a second source/drain coupled to a second end of the voltage-drop device, and a gate coupled to the bias-voltage node.

5. The circuit of claim 3, wherein the gated voltage-tracking circuit comprises an additional transistor comprising a first source/drain coupled to the bias-voltage node, a second source/drain, and a gate coupled to the gated-node.

6. The circuit of claim 5 further comprising a first diode coupled between the first source/drain and an end of the voltage-drop device, and a second diode coupled between the second source/drain and a second power supply node.

7. The circuit of claim 5, wherein the second source/drain is connected to the second power supply node.

8. The circuit of claim 1, wherein the voltage-drop device comprises:
  a first diode formed of a PMOS transistor; and
  a second diode formed of an NMOS transistor, wherein the first diode and the second diode are connected in parallel.

9. The circuit of claim 1, wherein the first power supply node is a VDD node, and the gated-voltage is a gated-VDD.

10. The circuit of claim 1, wherein the first power supply node is a VSS node, and the gated-voltage is a gated-VSS.

11. A circuit comprising:
  a first power supply node at a first power supply voltage;
  a gated-node;
  a first transistor comprising a source coupled to the first power supply node, and a drain coupled to the gated-node;
  a second transistor having a source coupled to the first power supply node, and a drain;
  a first diode coupled between the drain of the second transistor and the gated-node;
  a voltage-controlled current source connected in parallel with the first diode, wherein the voltage-controlled current source comprises an input node; and
  a gated voltage-tracking circuit comprising an output connected to the input node of the voltage-controlled source, wherein the gated voltage-tracking circuit is coupled to the gated-node, and is configured to generate a bias voltage tracking a variation in a gated-voltage at the gated-node.

12. The circuit of claim 11 further comprising a second diode connected in parallel with the first diode, wherein the first diode and the second diode are formed of transistors having different types.

13. The circuit of claim 11, wherein the voltage-controlled current source comprises a transistor comprising a first source/drain connected to a first end of the first diode, a second source/drain connected to the second end of the first diode, and a gate connected to the output of the gated voltage-tracking circuit.

14. The circuit of claim 11, wherein the gated voltage-tracking circuit comprises;
  a transistor comprising:
    a first source/drain connected to the input node of the voltage-controlled current source;
    a second source/drain; and
    a gate connected to the gated-node;
  a first bias-diode connected between a first end of the first diode and the first source/drain; and
  a second bias-diode connected between the second source/drain and a second power supply node.

15. The circuit of claim 11, wherein the first power supply node is a VDD node, and the gated-voltage is a gated-VDD.

16. The circuit of claim 11, wherein the first power supply node is a VSS node, and the gated-voltage is a gated-VSS.

17. A circuit comprising:
  a VDD power node;
  a gated-node;
  a first PMOS transistor comprising a source coupled to the VDD power node, and a drain coupled to the gated-node;
  a second PMOS transistor having a source coupled to the VDD power node, and a drain;
  a first diode and a second diode connected in parallel and coupled between the drain of the second PMOS transistor and the gated-node, wherein the first diode and the second diode are formed of transistors having opposite types;
  a bias node;
  a third PMOS transistor comprising:
    a source coupled to the drain of the second PMOS transistor;
    a drain coupled to the gated-node; and
    a gate coupled to the bias node; and
  a gated voltage-tracking circuit coupled to, and outputting a bias voltage to, the bias node, wherein the gate voltage-tracking circuit is coupled to the gated-node, and is configured so that the bias voltage tracks a change in a gated-voltage at the gated-node.

18. The circuit of claim 17, wherein the gated voltage-tracking circuit comprises:
  a fourth PMOS transistor comprising:
    a first source/drain connected to the bias node;
    a second source/drain; and
    a first gate connected to the gated-node;
  a first bias-diode connected between a first end of the first diode and the first source/drain; and
  a second bias-diode connected between the second source/drain and a VSS node.

19. The circuit of claim 18, wherein the gated voltage-tracking circuit further comprises:
  a fifth PMOS transistor comprising:
    a second gate connected to the gated-node;
    a third source/drain coupled to the bias node; and
    a fourth source/drain coupled to the VSS node.

20. The circuit of claim 17 further comprising:
  a VSS node; and
  a main circuit coupled between the gated-node and the VSS node.

* * * * *